(12) United States Patent
Ren et al.

(10) Patent No.: US 7,473,477 B2
(45) Date of Patent: Jan. 6, 2009

(54) PHOSPHORESCENT IRIDIUM COMPLEXES

(75) Inventors: Xiaofan Ren, Rochester, NY (US); Joseph C. Deaton, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 713 days.

(21) Appl. No.: 11/095,165

(22) Filed: Mar. 31, 2005

(65) Prior Publication Data

US 2006/0228578 A1   Oct. 12, 2006

(51) Int. Cl.
*H01L 51/54* (2006.01)
*C09K 11/06* (2006.01)

(52) U.S. Cl. .................. 428/690; 428/917; 313/504; 313/506; 257/E51.044

(58) Field of Classification Search .................. None
See application file for complete search history.

(56) References Cited

U.S. PATENT DOCUMENTS

| 5,484,922 | A | * | 1/1996 | Moore et al. ............ 546/7 |
| 2002/0134984 | A1 | | 9/2002 | Igarashi |
| 2002/0182441 | A1 | * | 12/2002 | Lamansky et al. .......... 428/690 |
| 2004/0091738 | A1 | * | 5/2004 | Psai et al. ............ 428/690 |
| 2007/0087221 | A1 | * | 4/2007 | Wu et al. ............ 428/690 |

FOREIGN PATENT DOCUMENTS

WO   2004/085450   10/2004

OTHER PUBLICATIONS

A. B. Tamayo, et al., "Synthesis and Characterization of Facial and Meridional Tris-cyclometalated Iridium(III) Complexes", J. Am. Chem. Soc., 2003, pp. 7377-7387.

* cited by examiner

*Primary Examiner*—Marie R. Yamnitzky
(74) *Attorney, Agent, or Firm*—Arthur E. Kluegel; Raymond L. Owens (57) ABSTRACT

An OLED device comprises a cathode, an anode, and located therebetween a light emitting layer containing a compound represented by formula (I):

$$A_m\text{-}M\text{-}B_n \qquad (I)$$

wherein
m+n=2 or 3 and neither m nor n is 0;
M is Ir, Pt, Os, Ru, Rh, or Pd;
$A_m$ includes at least one ligand A having a triplet energy of at least 2.9 eV as measured in a homoleptic complex of M and A; and
B is represented by the formula (II):

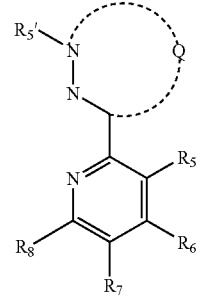

wherein
Q represents an atomic group forming a nitrogen-containing heterocyclic ring;
and R5, R6, R7, R8 and R5' independently represent a hydrogen atom or a substituent.

26 Claims, 2 Drawing Sheets

PHOSPHORESCENT IRIDIUM COMPLEXES

FIELD OF INVENTION

This invention relates to organic electroluminescent diode OLED) devices containing iridium complexes capable of triplet emissions in the deep blue spectral range.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322-334, 1969; and Dresner U.S. Pat. No. 3,710,167, issued Jan. 9, 1973. The organic layers in these devices, usually composed of a polycyclic aromatic hydrocarbon, were very thick (much greater than 1 μm). Consequently, operating voltages were very high, often >100V.

More recent organic EL devices include an organic EL element consisting of extremely thin layers (e.g. <1.0 μm) between the anode and the cathode. Herein, the term "organic EL element" encompasses the layers between the anode and cathode electrodes. Reducing the thickness lowered the resistance of the organic layer and has enabled devices that operate much lower voltage. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al [*J. Applied Physics*, Vol. 65, Pages 3610-3616, 1989]. The light-emitting layer commonly consists of a host material doped with a guest material. Still further, there has been proposed in U.S. Pat. No. 4,769,292 a four-layer EL element comprising a hole-injecting layer (HIL), a hole-transporting layer (HTL), a light-emitting layer (LEL) and an electron transport/injection layer (ETL). These structures have resulted in improved device efficiency.

Many emitting materials that have been described as useful in an OLED device emit light from their excited singlet state by fluorescence. The excited singlet state is created when excitons formed in an OLED device transfer their energy to the excited state of the dopant. However, it is generally believed that only 25% of the excitons created in an EL device are singlet excitons. The remaining excitons are triplet, which cannot readily transfer their energy to the singlet excited state of a dopant. This results in a large loss in efficiency since 75% of the available excitons are not used in the light emission process.

Triplet excitons can transfer their energy to a dopant if it has a triplet excited state that is low enough in energy. If the triplet state of the dopant is emissive it can produce light by phosphorescence. In many cases singlet excitons can also transfer their energy to lowest singlet excited state of the same dopant. The singlet excited state can often relax, by an intersystem crossing process, to the emissive triplet excited state. Thus, it is possible, by the proper choice of host and dopant, to collect energy from both the singlet and triplet excitons created in an OLED device and to produce a very efficient phosphorescent emission.

Phosphorescent metal complexes, such as fac-tris(phenylpyridine) iridium can be used as the active dopant in OLEDs (*Appl. Phys. Lett.* 1999, 75, 4). However, most of these complexes have emission spectra with peaks in the red and green region. Thompson reported blue phosphorescent devices in which the active dopant is fac-tris(2-(4',5'-difluorophenyl)pyridine-C, N)iridium(III) (*Polymer preprints* 2000, 41(1), 770). U.S. patents U.S. 2002/0134984A1 and U.S. 2004/0068132A1 also disclose iridium complexes that emit in the blue region, even though the colors are not saturated.

Notwithstanding these developments, there remains a need for new organometallic compounds that will provide light emission, especially high energy emission as required for deep blue and white emissions.

SUMMARY OF THE INVENTION

The invention provides an OLED device comprising a cathode, an anode, and located therebetween a light emitting layer containing a compound represented by formula (I):

$$A_m\text{-M-}B_n \quad (I)$$

wherein m+n=2 or 3 and neither m nor n is 0;

M is Ir, Pt, Os, Ru, Rh, Re or Pd;

$A_m$ includes at least one ligand A having a triplet energy of at least 2.9 eV as measured in a homoleptic complex of M and A; and B is represented by the formula (II):

wherein

Q represents an atomic group forming a nitrogen-containing heterocyclic ring;

and R5, R6, R7, R8 and R5' independently represent a hydrogen atom or a substituent.

The organometallic compounds will provide desirable light emission, especially high energy emission as required for deep blue and white emissions.

DETAILED DESCRIPTION OF THE INVENTION

According to the performance targets for high-resolution OLED displays which requires the CIEx+CIEy for saturated blue to be no larger than 0.33, very few existing phosphorescent dyes are blue enough and new blue phosphorescent dyes are in demand.

In an embodiment of the invention, phosphorescent light emitting materials are provided by a heteroleptic structure of Formula (1):

$$A_m\text{-}M\text{-}B_n \qquad (1)$$

In Formula (1), A and B are ligands with different structures. A is a ligand having a triplet energy of at least 2.9 eV as measured in a homoleptic complex of M and A.

B is represented by the formula (2):

(2)

wherein

Q represents an atomic group forming a nitrogen-containing heterocyclic ring;

and R5, R6, R7, R8 and R5' independently represent a hydrogen atom or a substituent.

In Formula (1), m and n are independently greater than or equal to 1 and sum to 2 or 3. Preferably, neither A or B is a monodentate ligand because monodentate ligands more readily dissociate from the metal center and often lead to an inferior thermal stability of the material.

In Formula (1), M is a metal having an atomic weight greater than 40. Preferably selected from metals Ir, Pt, Pd, Rh, Re, Ru, Os, Tl, W, Pb, Bi, In, Sn, Sb, Au and Ag. Typically, the metal is Pt or Ir.

Generally, the ligands are bidentate, which means they form two bonds with the metal, but bidentate ligands are not required. For Ir, to which three bidentate ligands may be attached, "m" may be 1 or 2, and "n" may be 1 or 2. In one embodiment, ligand A of Formula (1) is represented by Formula (3):

(3)

and is independently substituted with at least one electron withdrawing group at $R_1$, $R_2$, $R_3$, or $R_4$ to provide the ligand with a higher energy excited T1 state.

It is well within the skill of the art to determine whether a particular group is electron donating or electron accepting. The most common measure of electron donating and accepting properties is in terms of Hammett σ values. Hydrogen has a Hammett σ value of zero, while electron donating groups have negative Hammett σ values and electron accepting groups have positive Hammett σ values. Lange's handbook of Chemistry, $12^{th}$ Ed., McGraw Hill, 1979, Table 3-12, pp. 3-134 to 3-138, here incorporated by reference, lists Hammett σ values for a large number of commonly encountered groups. Preferably, the electron withdrawing group is selected from those having a Hammett's sigma para or meta value of at least 0.3.

The electron withdrawing group may suitably include F, $CF_3$, CN, $NO_2$, C(O)OR, C(O)R, C(O)NR, P(O)RR', P(S)RR', $SO_2$, SOR, SQR, $SO_3R$, BRR', and $B(OR)_2$ where the R and R' groups we substituents. $R_1'$, $R_2'$, or $R_3'$ may independently be electron donating groups to provide the ligand with a higher energy excited Ti state. The electron donating groups are conveniently selected from $C_1$-$C_{20}$ alkyl, $C_1$-$C_{20}$ alkoxy, NRR', and thiophene.

An example of ligand A based on Formula (2) is 2-(2,4-difluorophenyl)pyrazole (Lig-4):

Lig-4

Other examples include:

and

Calculated T1 value of the homoleptic Ir complex of 2'-(2, 4-difluorophenyl)pyrazole is 3.09 eV (Table 1). The calculation is within 0.10 eV of the experimental data.

To achieve a close match to the National Television Standards Committee recommended blue for video displays, the phosphors used in OLEDs generally need to have triplet energies near 2.8-2.9 eV (emitting at $\lambda \approx 440$ nm).

The energy of a homoleptic phosphor is usually no greater than the triplet energy of its coordinating ligands. In a heteroleptic structure, the ligand with the highest triplet energy sets the upper energy limit of the resulting phosphors. Therefore, in order to obtain phosphors having triplet energies near 2.8-2.9 eV, at least one of the ligands comprising the phosphors should have a triplet energy no less than 2.9 eV.

TABLE 1

| Ligand | Et (eV) |
|---|---|
| Lig-1 | 2.75 |
| Lig-2 | 2.75 |

TABLE 1-continued

| Ligand | Et (eV) |
|---|---|
| Lig-3 | 2.70 |
| Lig-4 | 3.09 |

Lig-1, Lig-2, and Lig-3 shown in Table 1 have been disclosed as high triplet energy ligands in U.S. patent applications U.S. 2002/013984 and U.S. 2004/0091738. The calculated T1 values of their corresponding homoleptic Ir complexes are also listed. It is believed that the same method used to evaluate a series of structurally similar materials computationally will give reasonably accurate information about their relative T1 states, and therefore about the relative T1 energies of the ligands in the complexes. It has also been found that the computation method used here is reasonably accurate in terms of predicting the T1 states of cyclometalated Ir complexes.

The triplet energies of the homoleptic Ir complexes of ligands Lig-1, Lig-2 and Lig-3 are all below 2.8 eV. This may limit their use as ligands in deep blue phosphors unless they are used with other ligands having higher triplet energies. On the other hand, the high triplet energy of 2'-(2,4-difluorophenyl)pyrazole (Lig-4) makes it a suitable ligand candidate for deep blue phosphors.

In one embodiment, the material of formula (II) has the structure of formula (4):

(4)

wherein $R_5$, $R_6$, $R_7$, $R_8$, $R_5'$, and $R_6'$ may each independently selected from the group consisting of a hydrogen and any substituent. Where there are multiply substituents, $R_5$, R6, $R_7$, R8, $R_5'$, and $R_6'$ may be linked to another of the groups $R_5$, $R_6$, $R_7$, $R_8$, $R_5'$, and $R_6'$ to form a ring. Preferably, the material of formula (II) is substituted with at least one electron withdrawing group having a negative Hammett's sigma para or meta value at $R_5'$, or $R_6'$. More preferably, the electron withdrawing group is independently selected from those having a Hammett's sigma para or meta value of at least 0.3, such as F, $CF_3$, CN, $NO_2$, C(O)OR, C(O)R, C(O)NR, P(O)RR', P(S)RR', $SO_2$, SOR, $SO_2R$, $SO_3R$, BRR', and $B(OR)_2$ groups wherein each R and R' is a substituent. $R_5$, $R_6$, $R_7$, or $R_8$ may independently be electron-donating groups having a negative Hammett's sigma para or meta value. The electron donating groups are conveniently selected from $C_1$-$C_{20}$ alkyl, $C_1$-$C_{20}$ alkoxy, NRR', phenyl, and thiophene groups wherein each R and R' is a substituent.

Examples of the material of formula (II) include:

Unless otherwise specifically stated, use of the term "substituted" or "substituent" means any group or atom other than hydrogen. Unless otherwise specifically stated, use of the term "aromatic ring system" means a system of one ring or more than one ring fused together, where the entire ring system is aromatic. Unless otherwise specifically stated, use of the term "substituted phenyl ring" means a phenyl ring that is substituted and may be substituted to form one substituted or unsubstituted fused aromatic ring system, or more than one substituted or unsubstituted fused aromatic ring systems. Unless otherwise provided, when a group (including a compound or complex) containing a substitutable hydrogen is referred to, it is also intended to encompass not only the unsubstituted form, but also form further substituted with any substituent group, or groups as herein mentioned, including a fused ring, so long as the substituent does not destroy properties necessary for utility. Suitably, a substituent group may be halogen or may be bonded to the remainder of the molecule by an atom of carbon, silicon, oxygen, or phosphorous.

The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonyl amino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecyl-benzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain the desired desirable properties for a specific application and can include, for example, electron-withdrawing groups, electron-donating groups, and steric groups.

The following exemplify compounds useful in the invention:

I-101

I-102

I-103

I-104

I-105

-continued

I-106

I-107

I-108

I-109

I-110

-continued

I-111

I-116

I-112

I-117

I-113

I-118

I-114

I-115

General Device Architecture

The present invention can be employed in many OLED device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

Figure 1:
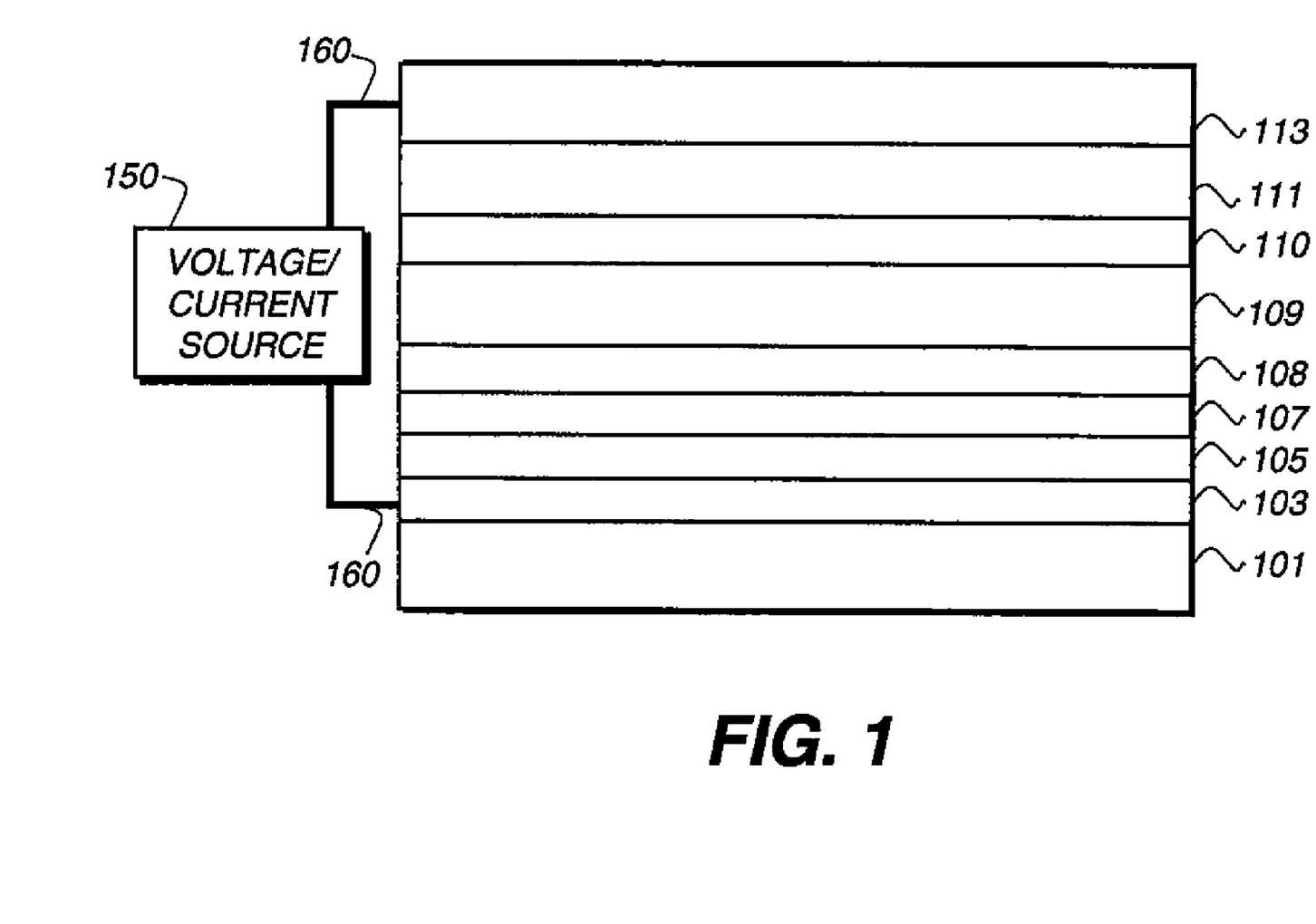
FIG. 1 shows a schematic cross-section of an OLED device of this invention, not to scale.

A typical structure according to the present invention and especially useful for a small molecule device, is shown in FIG. 1 and is comprised of a substrate 101, an anode 103, a hole injecting layer 105, a hole transporting layer 107, an exciton blocking layer 108, a light emitting layer 109, a hole blocking layer 110, an electron transporting layer 111, and a cathode 113. These layers are described in detail below. Note that the substrate 101 may alternatively be located adjacent to the cathode 113, or the substrate 101 may actually constitute the anode 103 or cathode 113. The organic layers between the anode 103 and cathode 113 are conveniently referred to as the organic EL element. Also, the total combined thickness of the organic layers is desirably less than 500 nm.

The anode 103 and cathode 113 of the OLED are connected to a voltage/current source 150 through electrical conductors 160. The OLED is operated by applying a potential between the anode 103 and cathode 113 such that the anode 103 is at a more positive potential than the cathode 113. Holes are injected into the organic EL element from the anode 103 and electrons are injected into the organic EL element at the cathode 113. Enhanced device stability can sometimes be achieved when the OLED is operated in an AC mode where, for some time period in the AC cycle, the potential bias is reversed and no current flows. An example of an AC driven OLED is described in U.S. Pat. No. 5,552,678.

Substrate

The OLED device of this invention is typically provided over a supporting substrate where either the cathode or anode can be in contact with the substrate. The substrate can be a complex structure comprising multiple layers of materials. This is typically the case for active matrix substrates wherein TFTs are provided below the OLED layers. It is still necessary that the substrate, at least in the emissive pixilated areas, be comprised of largely transparent materials. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

Anode

When the desired electroluminescent light emission (EL) is viewed through the anode, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode, any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injecting Layer (HIL)

While not always necessary, it is often useful to provide a hole-injecting layer between the anode and the hole-transporting layer. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,127,004, U.S. Pat. No. 6,208,075 and U.S. Pat. No. 6,208,077, some aromatic amines, for example, m-MTDATA (4,4',4"-tris[(3-methylphenyl)phenylamino]triphenylamine), and inorganic oxides including vanadium oxide (VOx), molybdenum oxide (MoOx), and nickel oxide (NiOx). Alternative hole-injecting materials reportedly useful in organic EL devices are described in EP 0 891 121 A1 and EP 1 029 909 A1.

Hole-Transporting Layer (HTL)

The hole-transporting layer 107 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
N,N,N',N'-tetraphenyl-4,4'''-diamino-1,1':4',1":4",1'''-quaterphenyl
Bis(4-dimethylamino-2-methylphenyl)phenylmethane
1,4-bis[2-[4-[N,N-di(p-toly)amino]phenyl]vinyl]benzene (BDTAPVB)
N,N,N',N'-Tetra-p-tolyl-4,4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
4,4'-Bis[N-(1-naphthyl)-N-phenylamino]$_p$-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene 2,6-Bis[di-(1-naphthyl)amino]naphthalene 2,6-Bis[N-(1-naphthyl)-N-(2-naphthyl)amino]naphthalene N,N,N',N'-Tetra(2-naphthyl)-4,4"-diamino-p-terphenyl 4,4'-Bis {N-phenyl-N-[4-(1-naphthyl)-phenyl]amino}biphenyl 2,6-Bis[N,N-di(2-naphthyl)amino] fluorene 4,4',4"-tris[(3-methylphenyl)phenylamino]triphenylamine (MTDATA)

4,4'-Bis[N-(3-methylphenyl)-N-phenylamino]biphenyl (TPD)

Another class of useful hole-transporting materials includes polycyclic aromatic compounds as described in EP 1 009 041. Some hole-injecting materials described in EP 0 891 121 A1 and EP 1 029 909 A1, can also make useful hole-transporting materials. In addition, polymeric hole-transporting materials can be used including poly(N-vinylcarbazole) (PVK), polythiophenes, polypyrrole, polyaniline, and copolymers including poly(3,4-ethylenedioxythiophene)/poly(4-styrenesulfonate) also called PEDOT/PSS.

Light-Emitting Layer (LEL)

Suitably, the light-emitting layer 109 of the OLED device comprises a host material and one or more guest materials for emitting light. At least one of the guest materials is suitably a fluorescent or phosphorescent material. The light-emitting guest material(s) is usually present in an amount less than the amount of host materials and is typically present in an amount of up to 15 wt % of the host, more typically from 0.1-10 wt % of the host. For convenience, the light-emitting guest material may be referred to as a light emitting dopant. A phosphorescent guest material may be referred to herein as a phosphorescent material, or phosphorescent dopant. The phosphorescent material is preferably a low molecular weight compound, but it may also be an oligomer or a polymer. It may be provided as a discrete material dispersed in the host material, or it may be bonded in some way to the host material, for example, covalently bonded into a polymeric host.

Host Materials for Phosphorescent Materials

Suitable host materials should be selected so that the triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655; WO 01/39234; WO 01/93642; WO 02/074015; WO 02/15645, and U.S. 20020117662. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-N,N'-dicarbazole-biphenyl, m-(N,N'-dicarbazole)benzene, and poly(N-vinylcarbazole), including their derivatives.

Desirable host materials are capable of forming a continuous film. The light-emitting layer may contain more than one host material in order to improve the device's film morphology, electrical properties, light emission efficiency, and lifetime. The light emitting layer may contain a first host material that has good hole-transporting properties, and a second host material that has good electron-transporting properties. The following are examples of suitable host materials.

Phosphorescent Materials

Phosphorescent materials may be used singly or in combination with other phosphorescent materials, either in the same or different layers. Some other phosphorescent materials are described in WO 00/57676, WO 00/70655, WO 01/41512, WO 02/15645, U.S. 2003/0017361, WO 01/93642, WO 01/39234, U.S. Pat. No. 6,458,475, WO 02/071813, U.S. Pat. No. 6,573,651, U.S. 2002/0197511, WO 02/074015, U.S. Pat. No. 6,451,455, U.S. 2003/0072964, U.S. 2003/0068528, U.S. Pat. No. 6,413,656, U.S. Pat. No. 6,515,298, U.S. Pat. No. 6,451,415, U.S. Pat. No. 6,097,147, U.S. 2003/0124381, U.S. 2003/0059646, U.S. 2003/0054198, EP 1 239 526, EP 1

238 981, EP 1 244 155, U.S. 2002/0100906, U.S. 2003/0068526, U.S. 2003/0068535, JP 2003073387, JP 2003073388, U.S. 2003/0141809, U.S. 2003/0040627, JP 2003059667, JP 2003073665, and U.S. 2002/0121638.

The emission wavelengths of cyclometallated Ir(III) complexes of the type IrL$_3$ and IrL$_2$L', such as the green-emitting-fac-tris(2-phenylpyridinato-N,C$^2$)Iridium(III) and bis(2-phenylpyridinato-N,C$^{2'}$)Iridium(III)(acetylacetonate) may be shifted by substitution of electron donating or withdrawing groups at appropriate positions on the cyclometallating ligand L, or by choice of different heterocycles for the cyclometallating ligand L. The emission wavelengths may also be shifted by choice of the ancillary ligand L'. Examples of red emitters are the bis(2-(2'-benzothienyl)pyridinato-N,C$^{3'}$)Iridium(III)(acetylacetonate) and tris(2-phenylisoquinolinato-N,C)Iridium(III). A blue-emitting example is bis(2-(4,6-diflourophenyl)-pyridinato-N,C$^2$)Iridium(III)(picolinate).

Red electrophosphorescence has been reported, using bis (2-(2'-benzo[4,5-a]thienyl)pyridinato-N, C$^3$) iridium (acetylacetonate) [Btp$_2$Ir(acac)] as the phosphorescent material (Adachi, C., Lamansky, S., Baldo, M. A., Kwong, R. C., Thompson, M. E., and Forrest, S. R., *App. Phys. Lett.*, 78, 1622-1624 (2001).

Other important phosphorescent materials include cyclometallated Pt(II) complexes such as cis-bis(2-phenylpyridinato-N,C$^2$)platinum(II), cis-bis(2-(2'-thienyl)pyridinato-N, C$^{3'}$) platinum(II), cis-bis(2-(2'-thienyl)quinolinato-N,C$^{5'}$) platinum(II), or (2-(4,6-diflourophenyl)pyridinato-NC2') platinum (II) acetylacetonate. Pt(II) porphyrin complexes such as 2,3,7,8,12,13,17,18-octaethyl-21H, 23H-porphine platinum(II) are also useful phosphorescent materials.

Still other examples of useful phosphorescent materials include coordination complexes of the trivalent lanthanides such as Tb$^{3+}$ and Eu$^{3+}$ (J. Kido et al, *Appl. Phys. Lett.*, 65, 2124 (1994))

Blocking Layers

In addition to suitable hosts, an OLED device employing a phosphorescent material often requires at least one exciton 108 or hole blocking 110 layer to help confine the excitons or electron-hole recombination centers to the light-emitting layer comprising the host and phosphorescent material. In one embodiment, such a blocking layer would be placed between the electron-transporting layer and the light-emitting layer—see FIG. 1, layer 110. In this case, the ionization potential of the blocking layer should be such that there is an energy barrier for hole migration from the host into the electron-transporting layer, while the electron affinity should be such that electrons pass more readily from the electron-transporting layer into the light-emitting layer comprising host and phosphorescent material. It is further useful, but not absolutely required, that the triplet energy of the blocking material be greater than that of the phosphorescent material. Suitable hole-blocking materials are described in WO 00/70655 and WO 01/93642. Two examples of useful materials are bathocuproine (BCP) and bis(2-methyl-8-quinolinolato)(4-phenylphenolato)Aluminum(III) (BA1Q). Metal complexes other than BA1Q are also known to block holes and excitons as described in U.S. 20030068528. U.S. 20030175553 describes the use of fac-tris(1-phenylpyrazolato-N,C2)iridium(III) (Irppz) in an electron/exciton blocking layer.

Electron-Transporting Layer (ETL)

Preferred thin film-forming materials for use in forming the electron-transporting layer 111 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Cathode

When light emission is viewed solely through the anode, the cathode used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with an organic layer (e.g., an electron transporting layer (ETL)) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, as disclosed in U.S. Pat. No. 6,013,384, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234, 963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140, 763, U.S. Pat. No. 6,172,459, EP 1 076 368, U.S. Pat. No. 6,278,236, and U.S. Pat. No. 6,284,393. Cathode materials are typically deposited by any suitable methods such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Other Common Organic Layers and Device Architecture

In some instances, layers 109 and 111 can optionally be collapsed into a single layer that serves the function of supporting both light emission and electron transportation. It also known in the art that emitting dopants may be added to the hole-transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, EP 1 182 244, U.S. Pat. No. 5,683,823, U.S. Pat. No. 5,503,910, U.S. Pat. No. 5,405,709, and U.S. Pat. No. 5,283,182, U.S. 20020186214, U.S. 20020025419, U.S. 20040009367, and U.S. 6,627,333.

As indicated earlier, additional layers such as exciton, electron and hole-blocking layers as taught in the art may be employed in devices of this invention. Hole-blocking layers are commonly used to improve efficiency of phosphorescent emitter devices, for example, as in U.S. 20020015859, WO 00/70655A2, WO 01/93642A1, U.S. 20030068528 and U.S. 20030175553 A1.

This invention may be used in so-called stacked device architecture, for example, as taught in U.S. Pat. No. 5,703,436 and U.S. Pat. No. 6,337,492.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimation boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

One preferred method for depositing the materials of the present invention is described in U.S. 2004/0255857 and USSN 10/945,941 (now U.S. Pat. No. 7,288,286) where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: USSN 10/784,585 (now U.S. Pat. No. 7,232,588); USSN 10/805,980 (now U.S. Pat. No. 7,238,389); USSN 10/945,940 (now U.S. Pat. No. 7,288,285); USSN 10/945,941 (now U.S. Pat. No. 7,288,286); USSN 11/050,924 (published as U.S. 2006/0177576); and USSN 11/050,934 now U.S. Pat. No. 7,165,340). Using this second method, each material may be evaporated using different source evaporators or the solid materials may be mixed prior to evaporation using the same source evaporator.

Encapsulation

Most OLED devices are sensitive to moisture or oxygen, or both, so they are commonly sealed in an inert atmosphere such as nitrogen or argon. In sealing an OLED device in an inert environment, a protective cover can be attached using an organic adhesive, a metal solder, or a low melting temperature glass. Commonly, a getter or desiccant is also provided within the sealed space. Useful getters and desiccants include, alkali and alkaline metals, alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters in functional relationship with the light emitting areas of the display. Filters, polarizers, and anti-glare or anti-reflection coatings can also be provided over a cover or as part of a cover.

The OLED device may have a microcavity structure. In one useful example, one of the metallic electrodes is essentially opaque and reflective; the other one is reflective and semi-transparent. The reflective electrode is preferably selected from Au, Ag, Mg, Ca, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length can be tuned by selecting the thickness of the organic layers or by placing a transparent optical spacer between the electrodes. For example, an OLED device of this invention can have ITO spacer layer placed between a reflective anode and the organic EL media, with a semitransparent cathode over the organic EL media.

Embodiments of the invention may provide advantageous features such as operating efficiency, higher luminance, color hue, low drive voltage, and improved operating stability. Embodiments of the organometallic compounds useful in the invention may provide a wide range of hues including those useful in the emission of white light (directly or through filters to provide multicolor displays).

EXAMPLES

A specific representative embodiment of the invention will now be described, without intention of restricting the scope of the present invention defined by the claimed attached hereto.

Example 1

Synthesis of Transition Metal Complex I-101

Step 1

2-(2',4'-difluorophenyl)pyrazole (3.6 g, 20 mmol) and $K_3IrBr_6$ (6.3 g, 8 mmol) were added to a flask containing 90 ml 2-ethoxyethanol and 30 ml water. The reaction mixture was heated to reflux and stirred under a nitrogen atmosphere for 24 h. After cooling, the pale yellow precipitate was vacuum filtered and washed first with ethanol followed by heptanes. The product [2-(4',6'-diflouorophenyl)pyrazole]$_2$ Ir$_2$(μ-Br)$_2$[2-(4',6'-diflouorophenyl)pyrazole]$_2$ was dried in vacuum oven (4.2 g, 81%).

Step 2

To a 60 ml THF suspension of potassium t-butoxide (7.9 g, 59 mmol) and 2-acetylpyridine(7.1 g, 59 mmol) was added dropwise ethyl trifluoroacetate (10 g, 70 mmol) at 10° C., and the mixture was stirred at room temperature for 15 h. After the PH value of the mixture had been adjusted to 6-7 with 10% H$_2$SO$_4$, the solution was extracted with Et$_2$O. The organic layer was dried (MgSO$_4$) and evaporated. The residue was purified by column chromatography on silica gel with CH$_2$Cl$_2$ followed by recrystallization from ethanol to give 2-(3-oxo-4,4,4-trifluorobutanoyl)pyridine (10.2 g, 81%).

Step 3

Hydrazine hydrate (1.44 g, 27.7 mmol) was added dropwise to 2-(3-oxo-4,4,4-trifluorobutanoyl)pyridine (5 g, 23 mmol) in 250 ml diethyl ether, and the mixture was stirred at ambient temperature for 3.5 h. Most of the solvent was evaporated and the mixture was extracted with water. The organic layer was dried (MgSO$_4$) and evaporated to give 5-hydroxy-3-(pyridine-2-yl)-5-trifluoromethyl-4,5-dihydropyrazole (5.58 g, 78%).

Step 4

Compound 5-hydroxy-3-(pyridine-2-yl)-5-trifluoromethyl-4,5-dihydropyrazole (5.58 g, 24 mmol) was boiled under reflux in 300 ml ethanol in the presence of conc. sulfuric acid (1.85 ml) for 30 min. The reaction mixture was then extracted with water. Evaporation and chromatography (ethyl acetate/heptanes 1:5) gave 3-(pyridine-2-yl)-5-trifluoromethylpyrazole (4.2 g, 85%).

Step 5

[2-(4',6'-difluorophenyl)pyrazole]$_2$Ir$_2$(μ-Br)$_2$[2-(4',6'-difluorophenyl)pyrazole]$_2$ (0.15 g, 0.12 mmol), 3-(pyridine-2-yl)-5-trifluoromethylpyrazole (70 mg, 0.3 mmol) and 0.2 g of K$_2$CO$_3$ were refluxed under an nitrogen atmosphere in 2-ethoxyethanol for 18 h. After cooling to room temperature, water was added and a white precipitate was filtered and washed with water. The crude product was chromatographed on a silicon column with dichloromethane/methanol (9:1 v/v) as the mobile phase (110 mg, 60%).

Example 2

Synthesis of Transition Metal Complex C-1
(Comparison)

Step 1

2-(2',4'-difluorophenyl)pyridine (3.6 g, 19 mmol) and K$_3$IrBr6 (6.3 g, 8 mmol) were added to a flask containing 90 ml 2-ethoxyethanol and 30 ml water. The reaction mixture was heated to reflux and stirred under an nitrogen atmosphere for 24 h. After cooling, the pale yellow precipitate was vacuum filtered and washed first with ethanol followed by heptanes. The product [2-(4',6'-diflouorophenyl)pyridine]$_2$ Ir$_2$(μ-Br)$_2$[2-(4',6'-diflouorophenyl)pyridine]$_2$ was dried in vacuum oven (3.9 g, 78%).

Step 2

[2-(4',6'-difluorophenyl)pyridine]$_2$Ir$_2$(μ-Br)$_2$[2-(4',6'-difluorophenyl)pyridine]$_2$ (0.15 g, 0.12 mmol), 3-(pyridine-2-yl)-5-trifluoromethylpyrazole (70 mg, 0.3 mmol) and 0.2 g of K$_2$CO$_3$ were refluxed under an nitrogen atmosphere in 2-ethoxyethanol for 18 h. After cooling to room temperature, water was added and a white precipitate was filtered and washed with water. The crude product was chromatographed on a silicon column with dichloromethane/methanol (9:1 v/v) as the mobile phase (75 mg, 48%).

Example 1, an Ir complex containing 2'-(2,4-difluorophenyl)pyrazole as the high triplet energy ligand, is represented by formula I-101. The third bidentate ligand in this complex is 3-(pyridine-2-yl)-5-trifluoromethylpyrazole, the triplet energy of the homoleptic Ir complex of which is calculated to be 2.65 eV. This material has intense deep blue emission at room temperature in both solution (FIG. 2) and in solid state, with a triplet energy of 2.88 eV and CIE 0.13, 0.15).

I-101

As a comparison, Example 2 contains a similar Ir complex with 2'-(2,4-difluorophenyl)pyrazole replaced by ligand Lig-3 (C-1). It only gives a sky-blue emission (FIG. 2), with a triplet energy of 2.68 eV and a CIE (0.16, 0.29) (C-1 has been disclosed in U.S. patent publication U.S. 2002/0134984A1).

C-1

Figure 2:
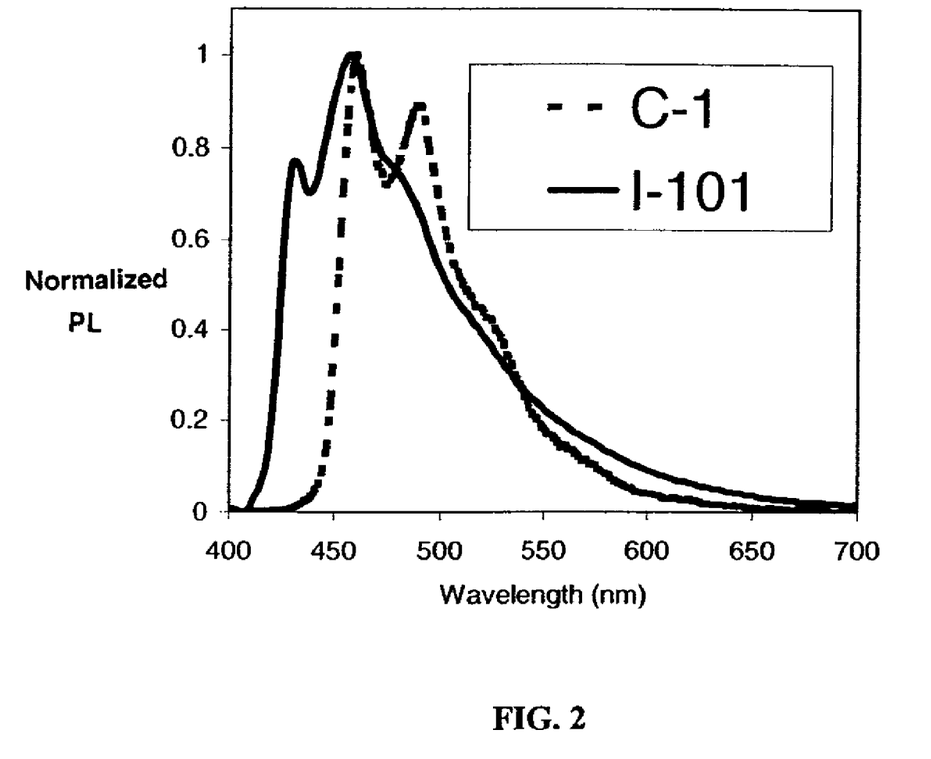
FIG. 2 shows the emission spectra for inventive sample I-101 and comparison sample C-1 at room temperature.

C-1 is not a pure blue phosphorescent emitter. Its triplet energy is lower than the 2.8V desired triplet energy for pure blue phosphorescent emitters. FIG. 2 shows the photoluminescence (PL) spectra of inventive I-101 vs. comparative C-1 with the inventive emitter having a much greater emission at lower wavelengths resulting in the desired blue.

It is important that at least one of the coordination ligands in the emitter have a triplet energy no less than 2.8 eV, and more preferably no less than 2.9 eV. The example above demonstrates this.

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

PARTS LIST

101 Substrate
103 Anode
105 Hole Injecting layer (HIL)
107 Hole Transporting layer (HTL)
108 Exciton blocking layer (EBL)
109 Light Emitting layer (LEL)
110 Hole Blocking layer (HBL)
111 Electron Transporting layer (ETL)
113 Cathode
150 Voltage/Current Source
160 Conductors

The invention claimed is:

1. An OLED device comprising a cathode, an anode, and located therebetween a light emitting layer containing a compound represented by formula (I):

$$A_m\text{-M-}B_n \quad (I)$$

wherein m+n=2 or 3 and neither m nor n is 0;

M is Ir, Pt, Os, Ru, Rh, Re or Pd;

$A_m$ includes at least one ligand A having a triplet energy of at least 2.9 eV as measured in a homoleptic complex of M and A; and

B is represented by the formula (II):

wherein

Q represents an atomic group forming a nitrogen-containing heterocyclic ring; and R5, R6, R7, R8 and R5' independently represent a hydrogen atom or a substituent; and wherein at least one ligand A of formula (I) is a 1-phenylpyrazole group represented by formula (II):

wherein $R_1$, $R_2$, $R_3$, $R_4$, $R_1'$, $R_2'$, and $R_3'$ are each hydrogen or an independently selected substituent.

2. The device of claim 1 wherein ligand A has a triplet energy of at least 3.0 eV as measured in a homoleptic complex of M and A.

3. The device of claim 1 wherein ligand A has a triplet energy of at least 3.1 eV as measured in a homoleptic complex of M and A.

4. The device of claim 1 wherein at least one of $R_1$, $R_2$, $R_3$, or $R_4$ is an electron withdrawing group having a positive Hammett's sigma para or meta value.

5. The device of claim 4 wherein the electron withdrawing group is selected from those having a Hammett's sigma pan or meta value of at least 0.3.

6. The device of claim 4 wherein the electron withdrawing group is selected from the group consisting of F, $CF_3$, CN, $NO_2$, C(O)OR, C(O)R, C(O)NR, P(O)RR', P(S)RR', $SO_2$, SOR, $SO_2R$, $SO_3R$, BRR', and $B(OR)_2$ groups wherein each R and R' is a substituent.

7. The device of claim 1 wherein at least one $R_1'$, $R_2'$, or $R_3'$ is represented by an electron donating group having a negative Hanimett's sigma para or meta value.

8. The device of claim 7 wherein the electron donating group is selected from $C_1$-$C_{20}$ alkyl, $C_1$-$C_{20}$ alkoxy, NRR', and thiophene groups wherein each R and R' is a substituent.

9. The device of claim 1 wherein at least one ligand A of formula (I) is selected from the group consisting of:

10. The device of claim 1 wherein at least one ligand B of formula (I) is a pyridylpyrazole.

11. The device of claim 10 wherein ligand B is represented by formula (III):

(III)

wherein each $R_5$, $R_6$, $R_7$, $R_8$, $R_5'$, and $R_6'$ is independently a hydrogen or substituent.

12. The device of claim 11 wherein ligand B is independently substituted with at least one electron withdrawing group having a positive Hammett's sigma pam or meta value at $R_5'$, or $R_6'$.

13. The device of claim 12 wherein the electron withdrawing group is selected from those having a Hanimett's sigma para or meta value of at least 0.3.

14. The device of claim 13 wherein the electron withdrawing group is selected from the group consisting of F, $CF_3$, CN, $NO_2$, C(O)OR, C(O)R, C(O)NR,P(O)RR', P(S)RR', $SO_2$, SOR, $SO_2R$, $SO_3R$, BRR', and $B(OR)_2$ groups wherein each R and R' is a substituent.

15. The device of claim 11 wherein ligand B is independently substituted with at least one electron donating group having a negative Rammett's sigma para or meta value at $R_5$, $R_6$, $R_7$, or $R_8$.

16. The device of claim 15 wherein the electron donating group is selected from $C_1$-$C_{20}$ alkyl, $C_1$-$C_{20}$ alkoxy, NRR', and thiophene groups wherein each R and R' is a substituent.

17. The device of claim 1 wherein ligand B of formula (I) is selected from the group consisting of:

18. The device of claim 1 wherein n is 2 and m is 1.
19. The device of claim 1 wherein n is 1 and m is 2.
20. The device of claim 1 wherein the device emits white light.
21. The device of claim 1 wherein the light emitted from the light-emitting layer is blue.
22. The device of claim 1 wherein the compound having formula (I) is in a layer which comprises a polymer.
23. The device of claim 1 wherein the compound having formula (I) is in a layer adjacent to a layer which comprises a polymer.
24. The device of claim 1 wherein the compound having formula (I) is polvmenc.
25. A stacked device comprising the device of claim 1.
26. The device of claim 1 wherein the light emitting layer contains a host material that has a triplet energy higher than that of the compound having formula (I) and the host is selected from: 4,4'-N,N'-dicarbazole-biphenyl (CBP), 2,2'-dimethyl-4,4'-N, N'-dicarbazole-biphenyl, m-(N,N'-dicarbazole)benzene, poly(N-vinylcarbazole) compounds, diphenyldi(o-tolyl)silane and p-bis(triphenylsilyl)silane.

* * * * *

UNITED STATES PATENT AND TRADEMARK OFFICE
CERTIFICATE OF CORRECTION

PATENT NO. : 7,473,477 B2  Page 1 of 1
APPLICATION NO. : 11/095165
DATED : January 6, 2009
INVENTOR(S) : Xiaofan Ren et al.

It is certified that error appears in the above-identified patent and that said Letters Patent is hereby corrected as shown below:

Title Page, item
(57) Abstract, First Page, Col. 2, line 15    delete "R5, R6, R7, R8 and R5'" and insert --$R_5$, $R_6$, $R_7$, $R_8$, and $R_{5'}$--, therefor.

Claim 1, Col. 23, line 62    delete "R5, R6, R7, R8 and R5'" and insert --$R_5$, $R_6$, $R_7$, $R_8$ and $R_{5'}$--, therefor.

Claim 5, Col. 24, line 32    delete "pan" and insert --para--, therefor.

Claim 7, Col. 24, line 42    delete "Hanimett's" and insert --Hammett's--, therefor.

Claim 12, Col. 25, line 21    delete "pam" and insert --para--, therefor.

Claim 13, Col. 25, line 24    delete "Hanimett's" and insert --Hammett's--, therefor.

Claim 15, Col. 25, line 33    delete "Rammett's" and insert --Hammett's--, therefor.

Claim 24, Col. 26, line 28    delete "polvmenc." and insert --polymeric.--, therefor.

Signed and Sealed this

Thirty-first Day of March, 2009

JOHN DOLL
*Acting Director of the United States Patent and Trademark Office*